(12) United States Patent
Panda et al.

(10) Patent No.: US 11,171,141 B2
(45) Date of Patent: Nov. 9, 2021

(54) GAP FILL METHODS OF FORMING BURIED WORD LINES IN DRAM WITHOUT FORMING BOTTOM VOIDS

(71) Applicant: Applied Materials, Inc., Santa Clara, CA (US)

(72) Inventors: Priyadarshi Panda, Newark, CA (US); Seshadri Ganguli, Sunnyvale, CA (US); Sang Ho Yu, Cupertino, CA (US); Sung-Kwan Kang, San Jose, CA (US); Gill Yong Lee, San Jose, CA (US); Sanjay Natarajan, Portland, OR (US); Rajib Lochan Swain, Sunnyvale, CA (US); Jorge Pablo Fernandez, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/804,226

(22) Filed: Feb. 28, 2020

(65) Prior Publication Data

US 2020/0286897 A1  Sep. 10, 2020

Related U.S. Application Data

(60) Provisional application No. 62/813,211, filed on Mar. 4, 2019, provisional application No. 62/832,572, filed on Apr. 11, 2019.

(51) Int. Cl.
*H01L 27/108* (2006.01)

(52) U.S. Cl.
CPC .. *H01L 27/10876* (2013.01); *H01L 27/10891* (2013.01)

(58) Field of Classification Search
CPC ......... H01L 27/10823; H01L 27/10876; H01L 27/10891
See application file for complete search history.

(56) References Cited

U.S. PATENT DOCUMENTS

| 9,748,137 | B2 | 8/2017 | Lai et al. |
| 2017/0084486 | A1 | 3/2017 | Zope et al. |
| 2018/0358362 | A1* | 12/2018 | Yen .................. H01L 27/10888 |

* cited by examiner

*Primary Examiner* — Hoai V Pham
(74) *Attorney, Agent, or Firm* — Servilla Whitney LLC (57) ABSTRACT

Methods of forming memory devices are described. Some embodiments of the disclosure utilize a low temperature anneal process to reduce bottom voids and seams in low melting point, low resistance metal buried word lines. Some embodiments of the disclosure utilize a high density dielectric cap during a high temperature anneal process to reduce bottom voids in buried word lines.

20 Claims, 4 Drawing Sheets

GAP FILL METHODS OF FORMING BURIED WORD LINES IN DRAM WITHOUT FORMING BOTTOM VOIDS

CROSS-REFERENCE TO RELATED APPLICATIONS

This application claims priority to U.S. Provisional Application No. 62/813,211, filed Mar. 4, 2019, and U.S. Provisional Application No. 62/832,572, filed Apr. 11, 2019, the entire disclosures of which are hereby incorporated by reference herein.

TECHNICAL FIELD

Embodiments of the present disclosure pertain to the field of electronic devices and electronic device manufacturing. More particularly, some embodiments of the disclosure provide dynamic random-access memory cells with buried word lines comprising low melting point metals and/or having reduced resistance.

BACKGROUND

Electronic devices, such as personal computers, workstations, computer servers, mainframes and other computer related equipment such as printers, scanners and hard disk drives use memory devices that provide substantial data storage capability, while incurring low power consumption. There are two major types of random-access memory cells, dynamic and static, which are well-suite for use in electronic devices. Dynamic random-access memories (DRAMs) can be programmed to store a voltage which represents one of two binary values, but require periodic reprogramming or "refreshing" to maintain this voltage for more than very short periods of time. Static random-access memories (SRAM) are so named because they do not require periodic refreshing.

DRAM memory circuits are manufactured by replicating millions of identical circuit elements, known as DRAM cells, on a single semiconductor wafer. Each DRAM cell is an addressable location that can store one bit (binary digit) of data. In its most common form, a DRAM cell consists of two circuit components: a field effect transistor (FET) and a capacitor.

The manufacturing of a DRAM cell includes the fabrication of a transistor, a capacitor, and three contacts: one each to the bit line, the word line, and the reference voltage. DRAM manufacturing is a highly competitive business. There is continuous pressure to decrease the size of individual cells and to increase memory cell density to allow more memory to be squeezed onto a single memory chip, especially for densities greater than 256 Megabits. Limitations on cell size reduction include the passage of both active and passive word lines through the cell, the size of the cell capacitor, and the compatibility of array devices with non-array devices.

In manufacturing, DRAM word lines often need to be able to endure severe thermal conditions which are necessary for later processing steps of the circuits. These severe thermal conditions can lead the metal contacts of the word line to delaminate and form bottom voids where the metal gap fill pulls-up from the bottom surface to form a void in the word line trench.

Therefore, there is a need for gap fill methods of forming low resistance buried word lines in DRAM cells able to withstand further processing conditions without forming bottom voids.

Further, the detection of the bottom voids during processing can be challenging. The defects associated with bottom voids are often not apparent until the device has been fully formed. The full process flow for forming a memory device can take approximately 6-8 weeks. Accordingly, device defects may not be apparent until 6-8 weeks after the word line is formed.

DRAM devices are often manufactured using high volume manufacturing (HVM) techniques. HVM techniques seek to manufacture many devices simultaneously. Therefore, there is a need for methods to evaluate word lines without having to wait for the full device formation process.

SUMMARY

One or more embodiments of the disclosure are directed to a method of forming a memory device. The method comprises providing a substrate having plurality of trenches thereon. Each trench has a trench depth. A conformal gate oxide layer is deposited on the substrate. A thickness of a first metal layer is formed on the conformal gate oxide layer. The thickness is less than or equal to 90% of the trench depth. A low temperature anneal of the substrate is performed. A thickness of a second metal layer is formed on the first metal layer. The thickness of the second metal layer at least fills the trench. The second metal layer is recessed to a predetermined depth to form a recessed metal layer.

Additional embodiments of the disclosure are directed to methods of forming a memory device. The methods comprise providing a substrate having plurality of trenches thereon. Each trench has a trench depth. A conformal gate oxide layer is deposited on the substrate. A thickness of a metal layer is formed on the conformal gate oxide layer. The thickness at least fills the trench. A low temperature anneal of the substrate is performed. The metal layer is recessed to a predetermined depth to form a recessed metal layer. A high density dielectric layer is deposited on the recessed metal layer. A high temperature anneal of the substrate is performed. The high density dielectric layer is removed.

Further embodiments of the disclosure are directed to methods of forming a memory device. The methods comprise providing a substrate having plurality of trenches thereon. Each trench has a trench depth. A conformal gate oxide layer is deposited on the substrate. A thickness of a metal layer is formed on the conformal gate oxide layer. The thickness is less than or equal to 90% of the trench depth. A low temperature anneal of the substrate is performed. An additional thickness of the metal layer is formed. The total thickness of the metal layer at least fills the trench. The metal layer is recessed to a predetermined depth to form a recessed metal layer. A high density dielectric layer is deposited on the recessed metal layer. A high temperature anneal of the substrate is performed. The high density dielectric layer is removed.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the terms "precursor", "reactant", "reactive gas" and the like are used interchangeably to refer to any gaseous species that can react with the substrate surface.

Figure 1:
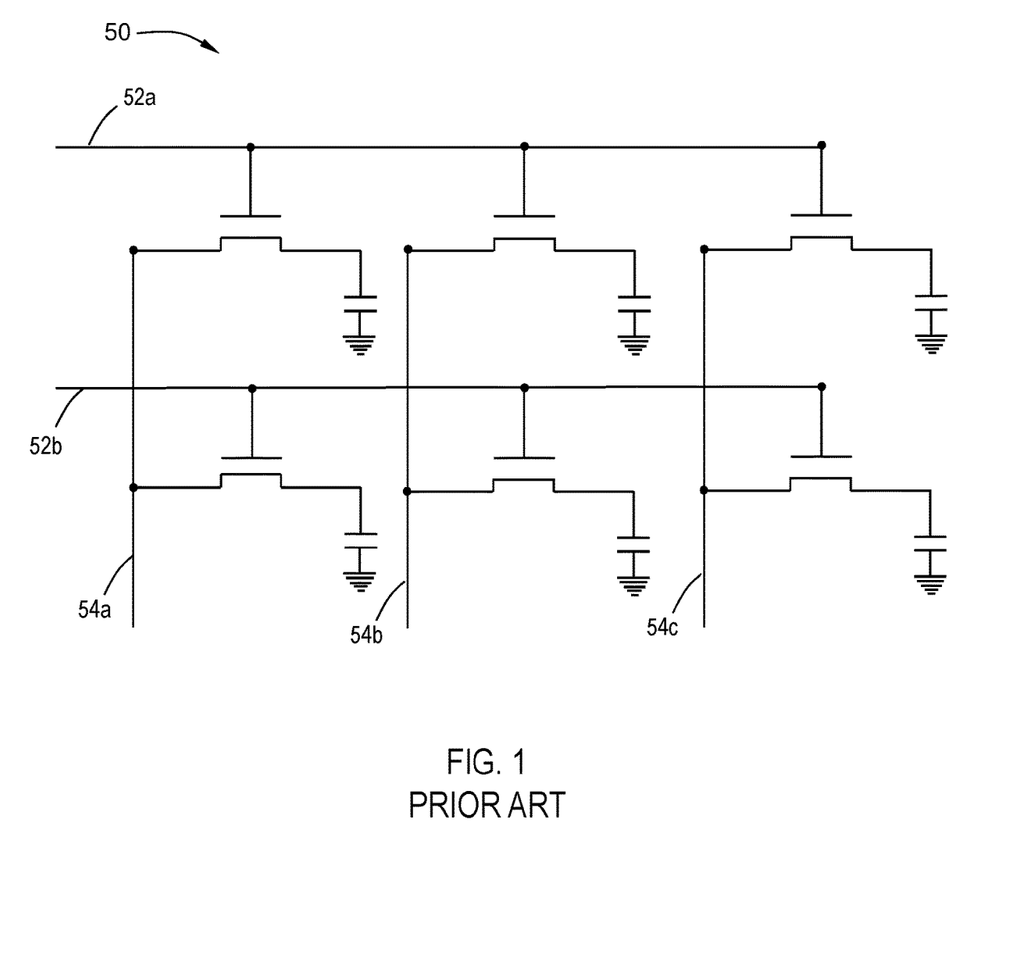
FIG. 1 illustrates a circuit diagram of a DRAM cell block in accordance with the prior art.

As used herein, the term "dynamic access random memory" or "DRAM" refers to a memory cell that stores a datum bit by storing a packet of charge (or not, for a zero) on a capacitor; the charge is gated onto the capacitor via an access transistor, and sensed by turning on the same transistor and looking at the voltage perturbation created by dumping the charge packet on the interconnect line on the transistor output. Thus, a single DRAM cell is made of one transistor and one capacitor. The DRAM device, as illustrated in FIG. 1, is formed of an array of DRAM cells. The rows on access transistors are linked by word lines 52a, 52b, and the transistor inputs/outputs are linked by bitlines 54a, 54b, 54c. Historically, DRAM capacitors have evolved from planar polysilicon-oxide-substrate plate capacitors to 3-D structures which have diverged into "stack" capacitors with both plates above the substrate), and "trench" capacitors using an etched cavity in the substrate as the common plate.

Traditionally, DRAM cells have recessed high work-function metal structures in buried word line structure. In a DRAM device, a bitline is formed in a metal level situated above the substrate, while the word line is formed at the polysilicon gate level at the surface of the substrate. In a buried word line (bWL) device, a word line is buried below the surface of a semiconductor substrate using a metal as a gate electrode.

The selection of metal to be used as a gate electrode can greatly impact the performance of the device. Without being bound by theory, it is believed that the use of low melting point metals with low resistance advantageously provides bWL DRAM with reduced resistance. However, when exposed to the thermal process requirements used in manufacturing bWL DRAM, these materials are often found to display bottom voids where the material at the bottom of a trench has pulled away from the bottom surface. These bottom voids can impact final array resistance and cause reliability issues.

Exemplary embodiments are described herein with reference to cross-sectional illustrations that are schematic illustrations of exemplary substrates. As such, variations from the shapes of the illustrations as a result, for example, of manufacturing techniques and/or tolerances, are to be expected. Thus, the illustrated embodiments should not be construed as limited to the particular shapes of regions illustrated herein but may be understood to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of disclosure.

Some embodiments of this disclosure advantageously form memory devices with high quality gap fill with a low melting point, low resistance and reduced bottom voids. FIGS. 2 through 10 are cross-sectional views illustrating a memory device 100 in various stages of processing according to one or more embodiments which utilize a low temperature anneal process.

Figure 2:
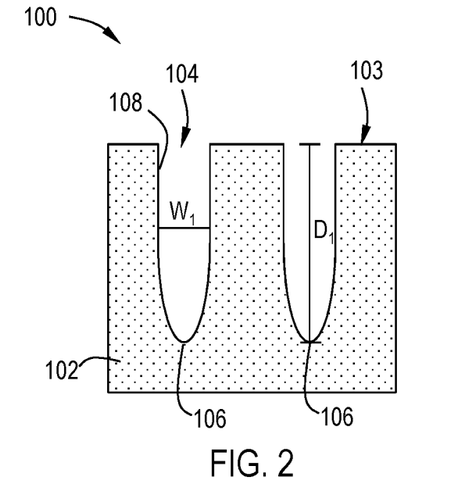
FIG. 2 illustrates a cross-section view of a device according to one or more embodiments of the disclosure.

Referring to FIG. 2, a substrate 102 is provided having a plurality of trenches 104 therein. The trenches 104 form a recessed channel. The trenches have a bottom 106 and sidewall 108. The plurality of trenches 104 may be formed so as to have a width within a range of about 10 to about 100 nm, including, but not limited to a range of about 10 nm to about 80 nm, about 10 nm to about 70 nm, about 10 nm to about 60 nm, about 10 nm to about 50 nm, or about 10 nm to about 40 nm. As will be recognized by one of skill in the art, the width of the plurality of trenches 104 is defined by a distance W1 from one sidewall 108 to another sidewall 108. The plurality of trenches 104 may be formed so as to have a depth within a range of about 120 nm to about 250 nm, including, but not limited to a range of about 120 nm to about 150 nm, about 150 nm to about 200 nm, about 200 nm to about 250 nm, about 120 nm to about 200 nm, or about 150 nm to about 250 nm. As will be recognized by one of skill in the art, the depth of the plurality of trenches 104 is defined by the distance D1 from the substrate surface 103 to the bottom 106 of the plurality of trenches 104.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

In order to form the plurality of trenches 104, a buffer insulating layer (e.g. a silicon oxide layer, not shown) may be formed on the substrate surface 103, and/or a hard mask layer (e.g. a nitride layer, not illustrated) may be formed. Such technique is well known to those skilled and the art, and, thus, is not illustrated.

Figure 3:
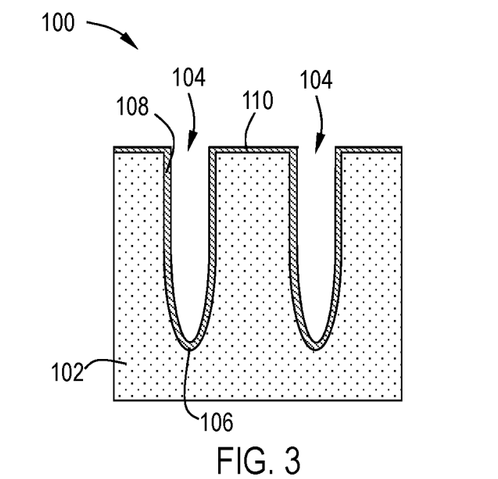
FIG. 3 illustrates a cross-section view of a device according to one or more embodiments of the disclosure.

With reference to FIG. 3, a gate oxide layer 110 is conformally deposited on the substrate 102, on the substrate surface 103 and along the sidewall 108 and bottom 106 of the plurality of trenches 104. In one or more embodiments, the gate oxide layer 110 comprises one or more of silicon oxynitride (SiON), silicon oxide, or a high-K dielectric material. While the term "silicon oxide" may be used to describe the gate oxide layer 110, the skilled artisan will recognize that the disclosure is not restricted to a particular stoichiometry. For example, the terms "silicon oxide" and "silicon dioxide" may both be used to describe a material having silicon and oxygen atoms in any suitable stoichiometric ratio. The same is true for the other materials listed in this disclosure, e.g. silicon nitride, silicon oxynitride, tungsten oxide, zirconium oxide, aluminum oxide, hafnium oxide, and the like.

In one or more embodiments, the term "high-K dielectric" refers to a material with a high dielectric constant (as compared to, e.g. silicon dioxide). In one or more embodiments, the high-K dielectric material is selected from one or more of hafnium oxide ($HfO_2$), zirconium oxide ($ZrO_2$), vanadium oxide ($VO_2$), titanium oxide ($TiO_2$), tin oxide ($SnO_2$), aluminum oxide ($Al_2O_3$), zinc oxide (ZnO), hafnium silicon oxide (HfSiO), or zirconium silicon oxide (ZrSiO).

In one or more embodiments, the gate oxide layer 110 has a thickness in a range of about 1 nm to about 7 nm, including about 1 nm, about 2 nm, about 3 nm, about 4 nm, about 5 nm, about 6 nm, or about 7 nm.

Figure 4:
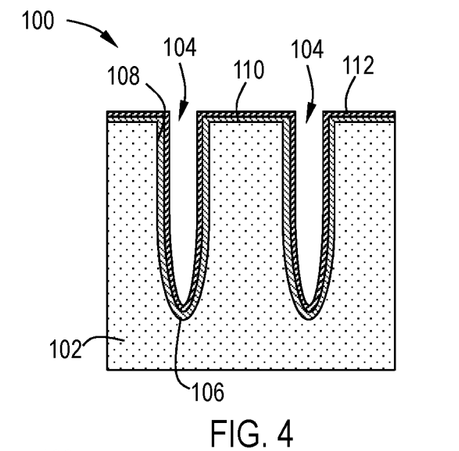
FIG. 4 illustrates a cross-section view of a device according to one or more embodiments of the disclosure.
Figure 5:
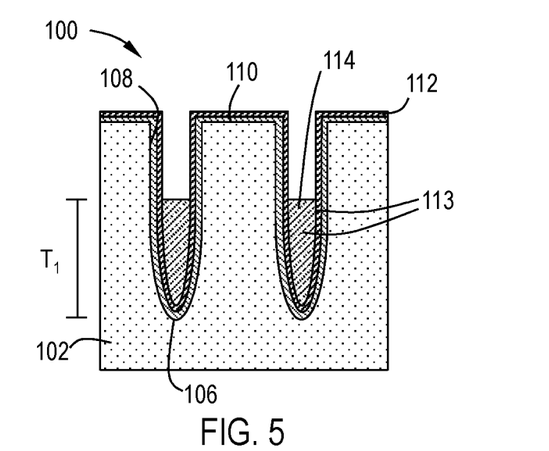
FIG. 5 illustrates a cross-section view of a device according to one or more embodiments of the disclosure.

With reference to FIGS. 4 and 5, a first metal layer 113 is formed on the gate oxide layer 110. In one or more embodiments, the first metal layer 113 is formed by depositing a work-function metal layer 112 (see FIG. 4) on the gate oxide layer 110, followed by depositing a metal layer 114 (see FIG. 5) on the work-function metal layer 112.

As used herein, the term "work-function" refers to the bulk chemical potential of a material (e.g. metal) relative to the vacuum level. In one or more embodiments, the work-function metal layer has a work function greater than or equal to 4.3 eV. In some embodiments, the work-function metal layer has a work function greater than or equal to 4.5 eV. In other embodiments, the work-function metal layer has a work-function greater than or equal to 4.3 eV, including greater than or equal to 4.4 eV, greater than or equal to 4.5 eV, greater than or equal to 4.6, greater than or equal to 4.7 eV, greater than or equal to 4.8 eV, greater than or equal to 4.9 eV, greater than or equal to 5.0 eV, greater than or equal to 5.1 eV, or greater than or equal to 5.2 eV.

In one or more embodiments, the work-function metal layer comprises a metal nitride. In one more embodiments, the work-function metal layer comprises one or more of titanium nitride (TiN), tungsten nitride (WN), tantalum nitride (TaN), molybdenum nitride (MoN), TaN/TiN, or WN/TiN. In one more embodiments, the work-function metal layer is selected from the group consisting of titanium nitride (TiN), tungsten nitride (WN), tantalum nitride (TaN), molybdenum nitride (MoN), TaN/TiN, WN/TiN, and combinations thereof. In one or more embodiments, the work-function metal layer comprises titanium nitride. In one or more embodiments, the work-function metal layer may also be referred to the high/mid work-function metal layer.

In one or more embodiments, the work-function metal layer 112 has a thickness in a range of about 1 nm to about 5 nm, including about 1 nm, about 2 nm, about 3 nm, about 4 nm, or about 5 nm.

The metal layer 114 is deposited using any one of a number of methods known to one of skill in the art, including, but not limited to, chemical vapor deposition, physical vapor deposition, or atomic layer deposition.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A, e.g. aluminum precursor) is pulsed into the reaction zone followed by a first time delay. Next, a second precursor or compound B (e.g. oxidant) is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors.

Plasma enhanced chemical vapor deposition (PECVD) is widely used to deposit thin films due to cost efficiency and film property versatility. In a PECVD process, for example, a hydrocarbon source, such as a gas-phase hydrocarbon or a vapor of a liquid-phase hydrocarbon that have been entrained in a carrier gas, is introduced into a PECVD chamber. A plasma-initiated gas, typically helium, is also introduced into the chamber. Plasma is then initiated in the chamber to create excited CH-radicals. The excited CH-radicals are chemically bound to the surface of a substrate positioned in the chamber, forming the desired film thereon. Embodiments described herein in reference to a PECVD process can be carried out using any suitable thin film deposition system. Any apparatus description described herein is illustrative and should not be construed or interpreted as limiting the scope of the embodiments described herein.

In some embodiments, the metal layer 114 comprises ruthenium. In some embodiments, the metal layer 114 comprising ruthenium is deposited as described below with respect to FIGS. 15-18.

Figure 15:
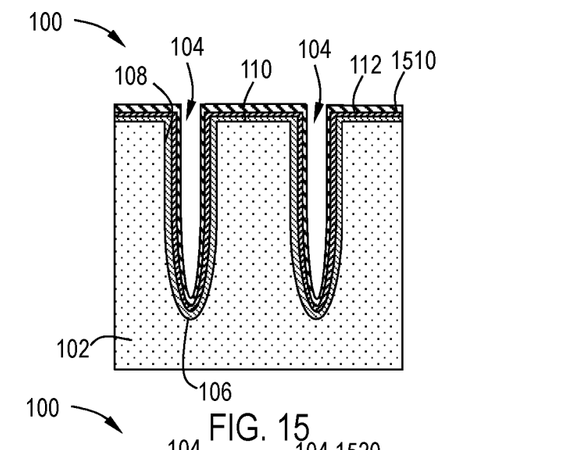
FIG. 15 illustrates a cross-section view of a device according to one or more embodiments of the disclosure.

With reference to FIG. 15, in some embodiments, a substrate 102, as shown in FIG. 4, optionally has a ruthenium seed layer 1510 deposited on the surface of the work-function metal layer 112. Any suitable process may be used to deposit the ruthenium seed layer 1510. In some embodiments, the ruthenium seed layer 1510 is deposited by a plasma-enhanced atomic layer deposition (PEALD) process. In some embodiments, the substrate 102 is sequentially exposed to a ruthenium precursor and an ammonia plasma. In some embodiments, the processing pressure is in a range of about 2 torr to about 10 torr.

In some embodiments, as shown, the ruthenium seed layer 1510 is conformal to the surface of the work-function metal layer 112. In some embodiments, the thickness of the ruthenium seed layer 1510 is greater than or equal to 0 and less than or equal to about 2 nm, With reference to FIG. 16, a first quantity 1520 of ruthenium is deposited on the work-function metal layer 112 or the ruthenium seed layer 1510. For clarity, in FIG. 16, the gate oxide layer 110 and the work-function metal layer 112 are not shown. The first quantity 1520 of ruthenium is not sufficient to close the top of the trench 104.

Figure 16:
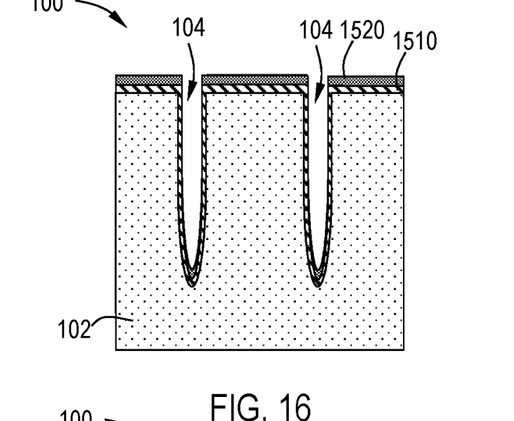
FIG. 16 illustrates a cross-section view of a device according to one or more embodiments of the disclosure.

The first quantity 1520 of ruthenium may be deposited by any suitable process. In some embodiments, the first quantity 1520 of ruthenium is deposited by an atomic layer deposition process which utilizes a ruthenium precursor and an alkyl halide.

After the first quantity 1520 of ruthenium is deposited, the substrate is treated to reduce deposition on the substrate surface 103 and at the top of the trench 104. In some embodiments, the treatment process comprises exposing the substrate 102 to hydrogen. In some embodiments, the substrate 102 is exposed to a hydrogen plasma.

Without being bound by theory, it is believed that the hydrogen plasma of some embodiments prevents deposition on the exposed surfaces. As the direction of plasma exposure can be controlled, it is possible to treat only select surfaces. Exposing the substrate 102 to hydrogen plasma allows for preferential deposition deep within the trench 104 relative to the substrate surface 103 or at the top of the trench 104. The prevention of deposition on the substrate surface 103 and at the top of the trench 104 reduces the potential for seams and voids within the metal layer 114.

Figure 17:
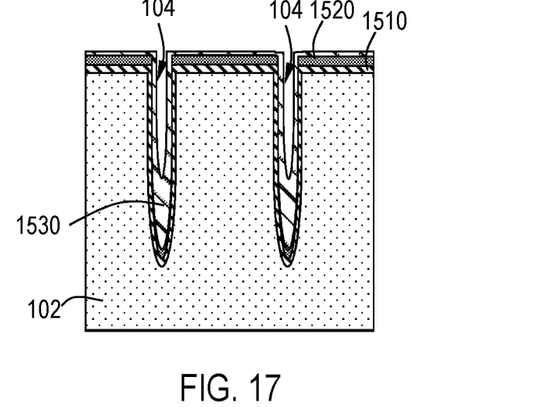
FIG. 17 illustrates a cross-section view of a device according to one or more embodiments of the disclosure.

With reference to FIG. 17, a second quantity 1530 of ruthenium is deposited on the first quantity 1520 of ruthenium. As shown in FIG. 17, after the treatment process described above, the second quantity 1530 of ruthenium is deposited at a greater rate within the trench 104 than on the substrate surface 103.

Figure 18:
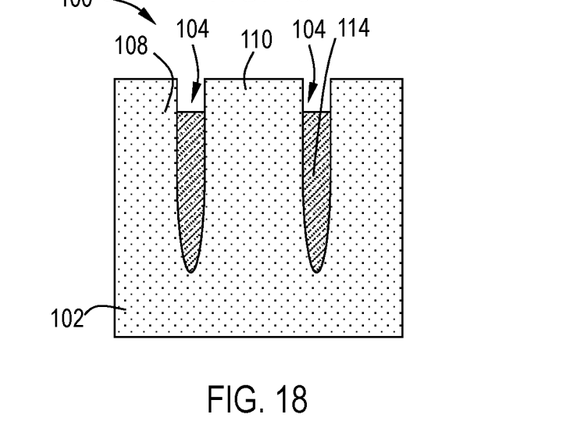
FIG. 18 illustrates a cross-section view of a device according to one or more embodiments of the disclosure.

With reference to FIG. 18, a low temperature anneal of the substrate is performed causing the ruthenium seed layer 1510 (if present), the first quantity 1520 and the second quantity 1530 of ruthenium to reflow into the trench 104 to form metal layer 114. The low temperature anneal conditions are described more fully below.

Without being bound by theory, it is believed that the low temperature anneal conditions cause the deposited ruthenium to become flowable due to atomic rearrangements and/or a low melting point. Due to the capillary effect, ruthenium which is deposited outside of the trench on the substrate surface 103 is drawn into the trench 104.

In some embodiments, the thickness T1 of the first metal layer 113 is controlled. In some embodiments, the thickness T1 of the first metal layer 113 is controlled relative to the depth D1 of the plurality of trenches 104. In some embodiments, the thickness T1 is less than or equal to about 90%, less than or equal to about 80%, less than or equal to about 75%, less than or equal to about 70%, less than or equal to about 60%, less than or equal to about 50%, less than or equal to about 40%, less than or equal to about 30%, less than or equal to about 25%, or less than or equal to about 20% of the depth D1 of the plurality of trenches 104.

In some embodiments, a low temperature anneal of the substrate is performed. While anneal processes are generally well understood in the art, the low anneal process utilized in some embodiments controls the temperature and duration of exposure. Without being bound by theory, it is believed that the low temperature anneal process allows the first metal layer 113 to reflow into the trench, providing a higher quality gap fill with fewer seams or voids and lower resistance. It is also believed that the reflowing process prevents the later formation of bottom voids. In some embodiments, after the low temperature anneal process, the first metal layer 113 contains substantially no seams or voids. As used in this regard, a material which contains substantially no seam or voids has gaps, seams or voids which occupy less than 2%, less than 1% or less than 0.5% of the volume of the stated material.

In some embodiments, the low temperature anneal process is performed at a temperature of less than or equal to about 700° C., less than or equal to about 600° C. or less than or equal to about 500° C. In some embodiments, the low temperature anneal process is performed for a period in a range of about 5 minutes to about 20 minutes, about 7 minutes to about 15 minutes or about 8 minutes to about 10 minutes. In some embodiments, the low temperature anneal process is performed for a period of less than or equal to about 15 minutes, less than or equal to about 12 minutes, less than or equal to about 10 minutes, or less than or equal to about 9 minutes.

Figure 6:
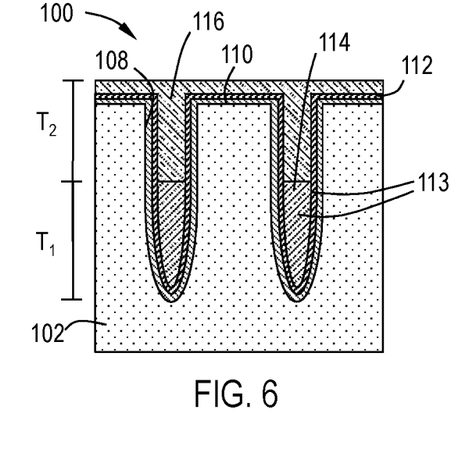
FIG. 6 illustrates a cross-section view of a device according to one or more embodiments of the disclosure.

With reference to FIG. 6, a thickness T2 of a second metal layer 116 is formed on the metal layer 114. The second metal layer 116 may be formed by any suitable process, including but not limited to those described herein with respect to metal layer 114. The thickness T2 of the second metal layer 116 at least fills the trench 104. Stated differently, the sum of T1 and T2 is greater than or equal to the depth D1 of the trench 104. In those embodiments in which the sum of T1 and T2 is in excess of the depth D1 of the trench 104, an overburden of the second metal layer 116 may be formed on the substrate.

Figure 7:
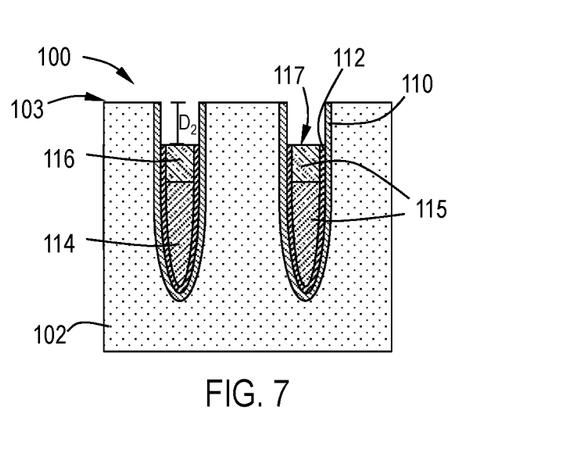
FIG. 7 illustrates a cross-section view of a device according to one or more embodiments of the disclosure.

With reference to FIG. 7, the second metal layer 116 is recessed to a predetermined depth D2 from the substrate surface 103. In some embodiments, as shown, the predetermined depth D2 is such that a portion of the second metal layer 116 remains within the trench. In some embodiments, the predetermined depth is such that the second metal layer 116 is completely removed from the trench 104.

In some embodiments, the second metal layer 116 is recessed (buried) by chemical mechanical polishing (CMP) and an etch back such that the second metal layer 116 and the work-function metal layer 112 do not protrude beyond the substrate surface 103 (e.g. so that the metal layer 114 and, if present, the second metal layer 116 are completely buried within the substrate 102).

In one or more embodiment, a buried word line 115 (i.e. the recessed second metal layer 116 and metal layer 114) may be formed. In some embodiments, as illustrated in FIG. 6, the work-function metal layer 112 is recessed to the same level as the buried word line 115. A top surface 117 of the buried word line 115 and the work-function metal layer 112 is a recess depth or distance D2 from the substrate surface 103 in the plurality of trenches 104.

In one or more embodiments, the metal layer 114 and the second metal layer 116 (i.e. the word line 115) comprise the same metal material. In some embodiments, the metal layer 114 and second metal layer 116 comprise one or more of ruthenium (Ru), molybdenum (Mo) or iridium (Ir).

After formation of the word line 115, processing of the substrate can continue to form a memory device. Such processes are known by the skilled artisan. An exemplary process flow for the continued formation of a memory device follows. In some embodiments, the memory device formed contains substantially no bottom void. As used in this regard, a device which contains substantially no bottom void shows no evidence of bottom peeling or voids between the bottom 106 of the trench 104 and the word line 115.

Figure 8:
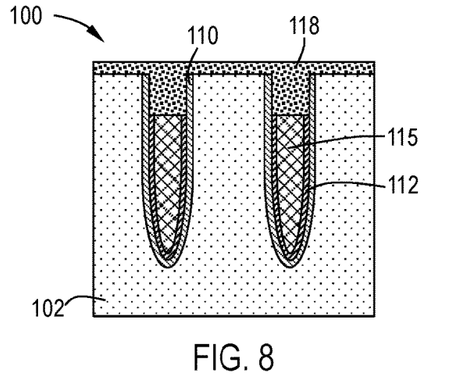
FIG. 8 illustrates a cross-section view of a device according to one or more embodiments of the disclosure.
Figure 9:
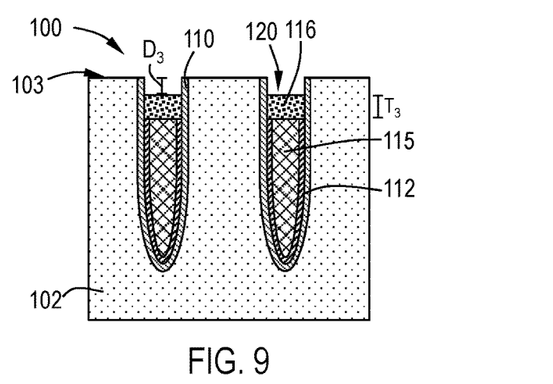
FIG. 9 illustrates a cross-section view of a device according to one or more embodiments of the disclosure.

With reference to FIG. 8, in one or more embodiments, a second work-function metal layer 118 is deposited on the substrate 102 on the word line 115. Referring to FIG. 9, the second work-function metal layer 118 is then polished using a chemical mechanical polishing (CMP) method and etched back to expose the substrate surface 103. A top surface 120 of the second work-function metal layer 118 is a distance D3 from the substrate surface 103 in the plurality of trenches 104. In one or more embodiments, the second work-function metal layer 118 has a top surface 120 within the depth D1 of the trench 104. Accordingly, in one or more embodiments D3 is less than D1.

In one or more embodiments, the second work-function metal layer 118 has a thickness T3 in a range of about 10 nm to about 50 nm, including about 10 nm, about 15 nm, about 20 nm, about 25 nm, about 30 nm, about 35 nm, about 40 nm, about 45 nm, or about 50 nm.

Figure 10:
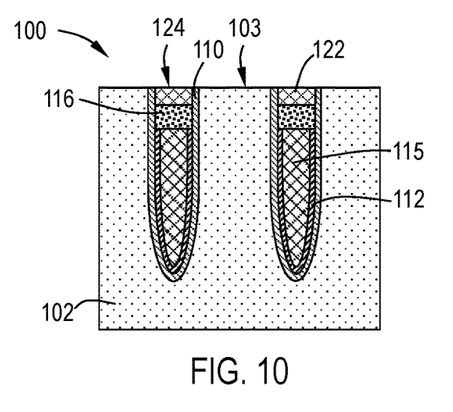
FIG. 10 illustrates a cross-section view of a device according to one or more embodiments of the disclosure.

Referring to FIG. 10, an insulating layer 122 is deposited on the second metal layer 116. In one or more embodiments, the insulating layer has a top surface 124 substantially coplanar with the substrate surface 103.

In one or more embodiments, the insulating layer 122 comprises a dielectric material. As used herein, the term "dielectric" refers to an electrical insulator material that can be polarized by an applied electric field. In one or more embodiments, the dielectric material includes, but is not limited to, oxides, e.g., $SiO_2$, $Al_2O_3$, nitrides, e.g., $Si_3N_4$. In one or more embodiments, the dielectric material comprises silicon nitride ($Si_3N_4$). In some embodiments, the insulating layer composition is non-stoichiometric relative to the ideal molecular formula. For example, in some embodiments, the dielectric material includes, but is not limited to, oxides (e.g., silicon oxide, aluminum oxide), nitrides (e.g., silicon nitride (SiN)), oxycarbides (e.g. silicon oxycarbide (SiOC)), and oxynitrocarbides (e.g. silicon oxycarbonitride (SiNCO)).

Some embodiments of this disclosure advantageously form memory devices with high quality gap fill with a low melting point, low resistance and reduced bottom voids. FIGS. 2-4, 11-14 and 8-10 are cross-sectional views illustrating a memory device 100 in various stages of processing according to one or more embodiments which utilize a high density cap during a high temperature anneal process.

Referring to FIGS. 2-4, a substrate 102 is provided with a plurality of trenches 104 thereon. The substrate 102 and the trenches 104 are as described above with respect to FIG. 2.

With reference to FIG. 3, a gate oxide layer 110 is conformally deposited on the substrate 102, on the substrate surface 103 and along the sidewall 108 and bottom 106 of the plurality of trenches 104. The particulars of the gate oxide layer 110 are as described above with respect to FIG. 3.

Figure 11:
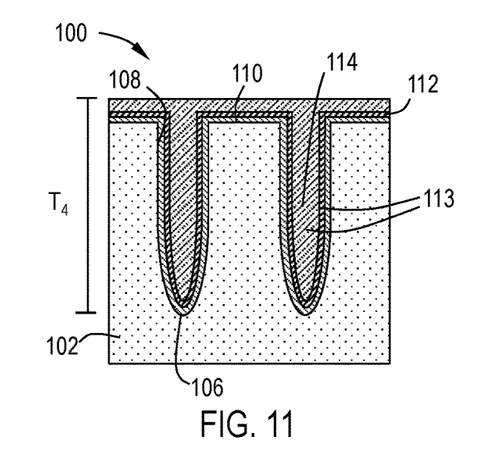
FIG. 11 illustrates a cross-section view of a device according to one or more embodiments of the disclosure.

Referring to FIGS. 4 and 11, a first metal layer 113 is formed on the gate oxide layer 110. In one or more embodiments, the first metal layer 113 is formed by depositing a work-function metal layer 112 (see FIG. 4) on the gate oxide layer 110, followed by depositing a metal layer 114 (see FIG. 11) on the work-function metal layer 112.

Referring to FIG. 11, in some embodiments, the thickness T4 of the metal layer 114 is controlled. In some embodiments, the thickness T4 of the metal layer 114 is controlled relative to the depth D1 of the plurality of trenches 104. In some embodiments, the thickness T4 of the metal layer 114 at least fills the trench 104. Stated differently, the thickness T4 of the metal layer 114 is greater than or equal to the depth D1 of the trench 104. In those embodiments in which the thickness T4 is in excess of the depth D1 of the trench 104, an overburden of the metal layer 114 may be formed on the substrate surface.

In some embodiments, a low temperature anneal of the substrate 102 is performed. While anneal processes are generally well understood in the art, the low anneal process utilized in some embodiments controls the temperature and duration of exposure. Without being bound by theory, it is believed that the low temperature anneal process allows the first metal layer 113 to reflow into the trench, providing a higher quality gap fill with fewer seams or voids and lower resistance. It is also believed that the reflowing process prevents the later formation of bottom voids. In some embodiments, after the low temperature anneal process, the first metal layer 113 contains substantially no seams or voids. As used in this regard, a material which contains substantially no seam or voids has gaps, seams or voids which occupy less than 2%, less than 1% or less than 0.5% of the volume of the stated material.

In some embodiments, the low temperature anneal process is performed at a temperature of less than or equal to about 700° C., less than or equal to about 600° C. or less than or equal to about 500° C. In some embodiments, the low temperature anneal process is performed for a period in a range of about 5 minutes to about 20 minutes, about 7 minutes to about 15 minutes or about 8 minutes to about 10 minutes. In some embodiments, the low temperature anneal process is performed for a period of less than or equal to about 15 minutes, less than or equal to about 12 minutes, less than or equal to about 10 minutes, or less than or equal to about 9 minutes.

Figure 12:
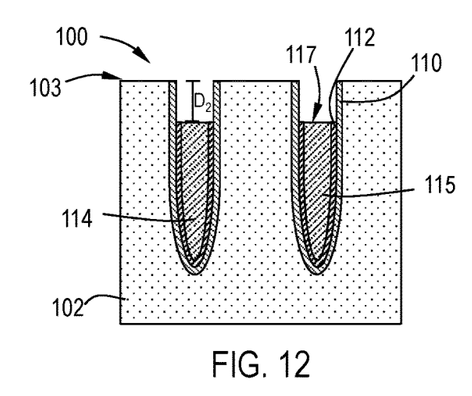
FIG. 12 illustrates a cross-section view of a device according to one or more embodiments of the disclosure.

With reference to FIG. 12, the metal layer 114 is recessed to a predetermined depth D2 from the substrate surface 103. In some embodiments, the metal layer 114 is recessed (buried) by chemical mechanical polishing (CMP) and an etch back such that the metal layer 114 and the work-function metal layer 112 do not protrude beyond the substrate surface 103 (e.g. so that the metal layer 114 is completely buried within the substrate 102).

In one or more embodiment, a buried word line 115 (i.e. the recessed metal layer 114) may be formed. In some embodiments, as illustrated in FIG. 12, the work-function metal layer 112 is recessed to the same level as the buried word line 115. A top surface 117 of the buried word line 115 and the work-function metal layer 112 is a recess depth or distance D2 from the substrate surface 103 in the plurality of trenches 104. In some embodiments, the metal layer 114 comprises one or more of ruthenium (Ru) or iridium (Ir).

Figure 13:
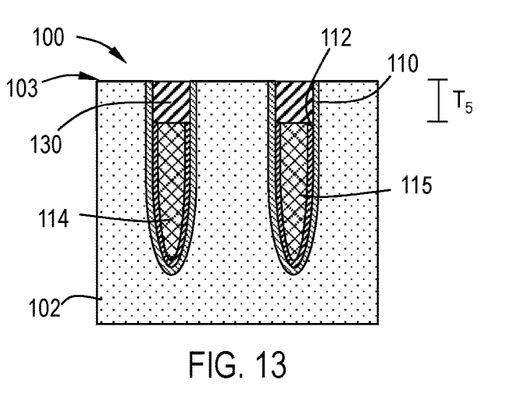
FIG. 13 illustrates a cross-section view of a device according to one or more embodiments of the disclosure.

With reference to FIG. 13, a high density dielectric layer 130 is deposited on the top surface 117 of the recessed metal layer 114 (i.e. the buried word line 115). The high density dielectric layer may be any suitable film with a significantly high density. In some embodiments, the high density dielectric layer comprises one or more of SiN or SiCN. In some embodiments, the high density dielectric layer 130 is deposited only within the trench 104.

The high density dielectric layer 130 may be deposited with a thickness T5. In some embodiments, as shown, T5 is about D2. In some embodiments, T5 is less than D2 and the trench is not completely filled. In some embodiments, T5 is greater than D2. In some embodiments when T5 is greater than D2, the high density dielectric material is not deposited on the substrate surface 103. In some embodiments when T5 is greater than D2, the high density dielectric layer 130 is deposited on the substrate surface 103 outside of the trench 104.

In some embodiments, a high temperature anneal of the substrate 102 is performed. While anneal processes are generally well understood in the art, the high temperature anneal process utilized in some embodiments controls the temperature and duration of exposure. Without being bound by theory, it is believed that the high density cap pushes on the metal layer 114 during the high temperature anneal process to prevent the formation of bottom voids.

In some embodiments, the high temperature anneal process is performed at a temperature of greater than or equal to about 800° C., greater than or equal to about 850° C. or greater than or equal to about 900° C. In some embodiments, the high temperature anneal process is performed at a temperature in a range of about 800° C. to about 900° C.

In some embodiments, the high temperature anneal process is performed for a period in a range of about 30 seconds to about 1 minute, about 30 seconds to about 45 seconds or about 45 seconds to about 1 minute. In some embodiments, the high temperature anneal process is performed for a period of less than or equal to about 2 minutes, less than or equal to about 1 minute, less than or equal to about 45 seconds, or less than or equal to about 30 seconds.

Figure 14:
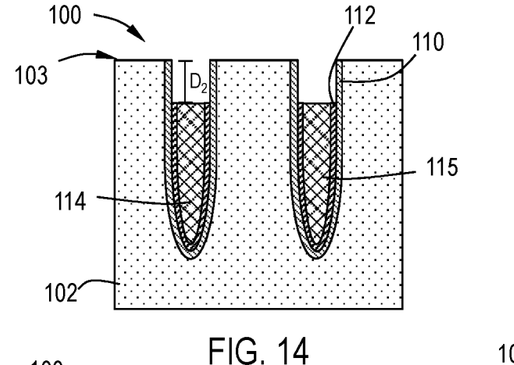
FIG. 14 illustrates a cross-section view of a device according to one or more embodiments of the disclosure.

With reference to FIG. 14, after the high temperature anneal process is performed, the high density dielectric layer 130 is removed or etched from the substrate. In some embodiments when the high density dielectric layer 130 comprises SiN, a hot phos etch process may be used to remove the high density dielectric layer 130. After removing the high density dielectric layer 130, the memory device is similarly formed as in FIG. 7, with a buried word line 115 located within a trench 104, and recessed from the substrate surface 103 by a distance D2, At this point the substrate illustrated in FIG. 14 may be processed through a similar process flow as described above with reference to FIGS. 8-10.

Some embodiments of this disclosure advantageously utilize a short loop process that enables detection of bottom voids or other issues with the word line 115 without fully forming the memory device. The short loop process is able to be performed quicker than the process of fully forming the memory device. In some embodiments, the short loop process is performed within a period of less than or equal to about 1 week, less than or equal to about 3 days or less than or equal to about 1 day.

With reference to FIGS. 13 and 14, after depositing the high density dielectric layer 130, a short flow high temperature anneal of the substrate 102 is performed. In some embodiments, the short flow high temperature anneal of the substrate differs from the high temperature anneal conditions described above. In some embodiments, the short flow high temperature anneal is performed at a higher temperature and/or for a longer duration than the high temperature anneal conditions described above.

Without being bound by theory, it is believed that the higher temperature and/or longer duration of the short flow high temperature anneal process more accurately simulates that thermal processing of the memory device through the remainder of the formation process. This simulation allows for the detection of bottom voids without fully forming the memory device.

In some embodiments, the short flow high temperature anneal process is performed at a temperature of greater than or equal to about 850° C., greater than or equal to about 900° C. or greater than or equal to about 950° C. In some embodiments, the short flow high temperature anneal process is performed at a temperature in a range of about 850° C. to about 950° C. In some embodiments, the short flow high temperature anneal process is performed at a temperature of about 900° C.

In some embodiments, the short flow high temperature anneal process is performed for a period in a range of about 1 minute to about 5 minutes, about 90 seconds to about 4 minutes or about 2 minutes to about 3 minutes. In some embodiments, the short flow high temperature anneal process is performed for a period of about 90 seconds, about 2 minutes or about 3 minutes.

Similar to FIG. 14, after performing the short flow high temperature anneal process, the high density dielectric layer 130 is removed. After the high density dielectric layer 130 is removed, an evaluation of the word line is performed to detect bottom voids. If bottom voids are detected, it is believed that the word line would have also exhibited bottom voids if processed through the remainder of the formation process.

In some embodiments, the evaluation is performed by e-beam metrology. In some embodiments, the e-beam metrology process utilizes a high landing energy. In some embodiments, the energy of the e-beam metrology process is in a range of about 10 keV to about 25 keV, in a range of about 12 keV to about 20 keV, or in a grange of about 15 keV to about 18 keV. In some embodiments, the energy of the e-beam metrology process is about 12 keV, about 15 eV, about 18 keV or about 20 keV.

Some embodiments of this disclosure advantageously form memory devices with high quality gap fill with a low melting point, low resistance and reduced bottom voids. FIGS. 2-7, 12-14 and 8-10 are cross-sectional views illustrating a memory device 100 in various stages of processing according to one or more embodiments which utilize a low temperature anneal process and a high density cap during a high temperature anneal process.

In general the process described herein should be understood by one skilled in the art as a combination of the two previously disclosed methods.

Referring to FIGS. 2-7 a substrate 102 is processed as described above. At the end of this process, FIG. 7 illustrates a similar structure to the structure illustrated in FIG. 12. In FIG. 7, the buried word line 115 comprises metal layer 114 and second metal layer 116. In FIG. 12, the buried word line 115 comprises metal layer 114. Accordingly, a substrate 102 processed through FIGS. 2-7 may subsequently be processed through FIGS. 12-14 as described above. Finally, as described above, a substrate 102 processed to FIG. 14 may be further processed through FIGS. 8-10 to form a memory device.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a memory device, the method comprising:
providing a substrate having plurality of trenches thereon, each trench having a trench depth;
depositing a conformal gate oxide layer on the substrate;
forming a thickness of a first metal layer on the conformal gate oxide layer, the thickness being less than or equal to about 90% of the trench depth;
performing a low temperature anneal of the substrate;
forming a thickness of a second metal layer on the first metal layer, the thickness of the second metal layer at least filling the trench; and
recessing the second metal layer to a predetermined depth to form a recessed metal layer.

2. The method of claim 1, wherein forming the first metal layer comprises depositing a conformal work-function metal layer on the conformal gate oxide layer and depositing a first metal layer on the conformal work-function metal layer.

3. The method of claim 1, wherein the first and second metal layers comprise Ru or Ir.

4. The method of claim 1, wherein the first metal layer fills less than or equal to about 50% of the trench depth.

5. The method of claim 1, wherein the low temperature anneal is performed at a temperature of less than or equal to about 700° C. for a period of less than or equal to about 10 minutes.

6. The method of claim 1, wherein after annealing the substrate, the first metal layer contains substantially no seams or voids.

7. The method of claim 1, wherein the memory device contains substantially no bottom void.

8. A method of forming a memory device, the method comprising:
providing a substrate having plurality of trenches thereon, each trench having a trench depth;
depositing a conformal gate oxide layer on the substrate;

forming a thickness of a metal layer on the conformal gate oxide layer, the thickness at least filling the trench;

performing a low temperature anneal of the substrate;

recessing the metal layer to a predetermined depth to form a recessed metal layer;

depositing a high density dielectric layer on the recessed metal layer;

performing a high temperature anneal of the substrate; and removing the high density dielectric layer.

9. The method of claim 8, wherein forming the metal layer comprises depositing a conformal work-function metal layer on the conformal gate oxide layer and depositing a metal layer on the conformal work-function metal layer.

10. The method of claim 8, wherein the metal layer comprises Ru or Ir.

11. The method of claim 8, wherein the low temperature anneal is performed at a temperature of less than or equal to about 600° C. for a period of less than or equal to about 10 minutes.

12. The method of claim 8, wherein after the low temperature anneal, the metal layer contains substantially no seams or voids.

13. The method of claim 8, wherein the predetermined depth is in a range of about 80 nm to about 90 nm.

14. The method of claim 8, wherein the high temperature anneal is performed at a temperature of greater than or equal to about 800° C. for a period of less than or equal to about 1 minute.

15. The method of claim 8, wherein the memory device contains substantially no bottom void.

16. A method of forming a memory device, the method comprising:

providing a substrate having plurality of trenches thereon, each trench having a trench depth;

depositing a conformal gate oxide layer on the substrate;

forming a thickness of a metal layer on the conformal gate oxide layer, the thickness being less than or equal to 90% of the trench depth;

performing a low temperature anneal of the substrate;

forming an additional thickness of the metal layer, the total thickness of the metal layer at least filling the trench;

recessing the metal layer to a predetermined depth to form a recessed metal layer;

depositing a high density dielectric layer on the recessed metal layer;

performing a high temperature anneal of the substrate; and removing the high density dielectric layer.

17. The method of claim 16, wherein forming the metal layer comprises depositing a conformal work-function metal layer on the conformal gate oxide layer and depositing a metal layer on the conformal work-function metal layer.

18. The method of claim 16, wherein the metal layer comprises Ru or Ir.

19. The method of claim 16, wherein the low temperature anneal is performed at a temperature of less than or equal to about 600° C. for a period of less than or equal to about 10 minutes, and the high temperature anneal is performed at a temperature of greater than or equal to about 800° C. for a period of less than or equal to about 1 minute.

20. The method of claim 16, wherein the memory device contains substantially no bottom void.

* * * * *